United States Patent [19]

Schumann et al.

[11] Patent Number: 5,094,968
[45] Date of Patent: Mar. 10, 1992

[54] FABRICATING A NARROW WIDTH EEPROM WITH SINGLE DIFFUSION ELECTRODE FORMATION

[75] Inventors: Steven J. Schumann, Sunnyvale; James C. Hu, Saratoga, both of Calif.

[73] Assignee: Atmel Corporation, San Jose, Calif.

[21] Appl. No.: 647,308

[22] Filed: Jan. 28, 1991

Related U.S. Application Data

[62] Division of Ser. No. 616,460, Nov. 21, 1990.

[51] Int. Cl.⁵ .................... H01L 21/265; H01L 21/72
[52] U.S. Cl. .......................................... 437/43; 437/49; 437/979; 148/DIG. 31; 148/DIG. 111
[58] Field of Search ............... 437/43, 49, 195, 979; 148/DIG. 31, DIG. 32, DIG. 111, DIG. 163; 357/23.5

[56] References Cited

U.S. PATENT DOCUMENTS

| 4,132,904 | 1/1979 | Harari | 357/23.5 |
| 4,203,158 | 5/1980 | Frohman-Bentchkowsky | 357/23.5 |
| 4,375,087 | 2/1983 | Wanlass | 357/23.5 |
| 4,477,825 | 10/1984 | Yaron et al. | 357/23.5 |
| 4,642,881 | 2/1987 | Matsukawa et al. | 437/43 |
| 4,727,043 | 2/1988 | Matsumoto et al. | 437/43 |
| 4,822,750 | 4/1989 | Perlegos et al. | 437/43 |
| 4,851,361 | 7/1989 | Schumann et al. | 437/43 |
| 4,945,068 | 7/1990 | Sugaya | 437/43 |

OTHER PUBLICATIONS

Harari et al., "A 256-Bit Nonvolatile Static RAM," 1978 IEEE International Solid State Circuits Conference, *Digest of Technical Papers*, pp. 108–109.

Primary Examiner—Brian E. Hearn
Assistant Examiner—C. Chaudhari
Attorney, Agent, or Firm—Schneck & McHugh

[57] ABSTRACT

An EEPROM design featuring narrow linear electrodes including a source, a drain, a thin oxide, channel and floating gate. A pair of linear, opposed field oxide barrier walls form widthwise boundaries of the active structure which can be very closely spaced. The drain electrode, implanted in the substrate, abuts both opposed field oxide lateral walls, but does not extend under either wall. The source, drain and channel are formed in a single implant followed by diffusion after the field oxide barrier walls are formed, but prior to formation of the floating gate. All but opposed field oxide walls in a stripe design. A control gate is disposed over the floating gate. The combination of opposed field oxide barrier walls, a stripe electrode design, and single step implant for electrode formation results in a very compact cell, utilizing a simplified EEPROM process.

4 Claims, 2 Drawing Sheets

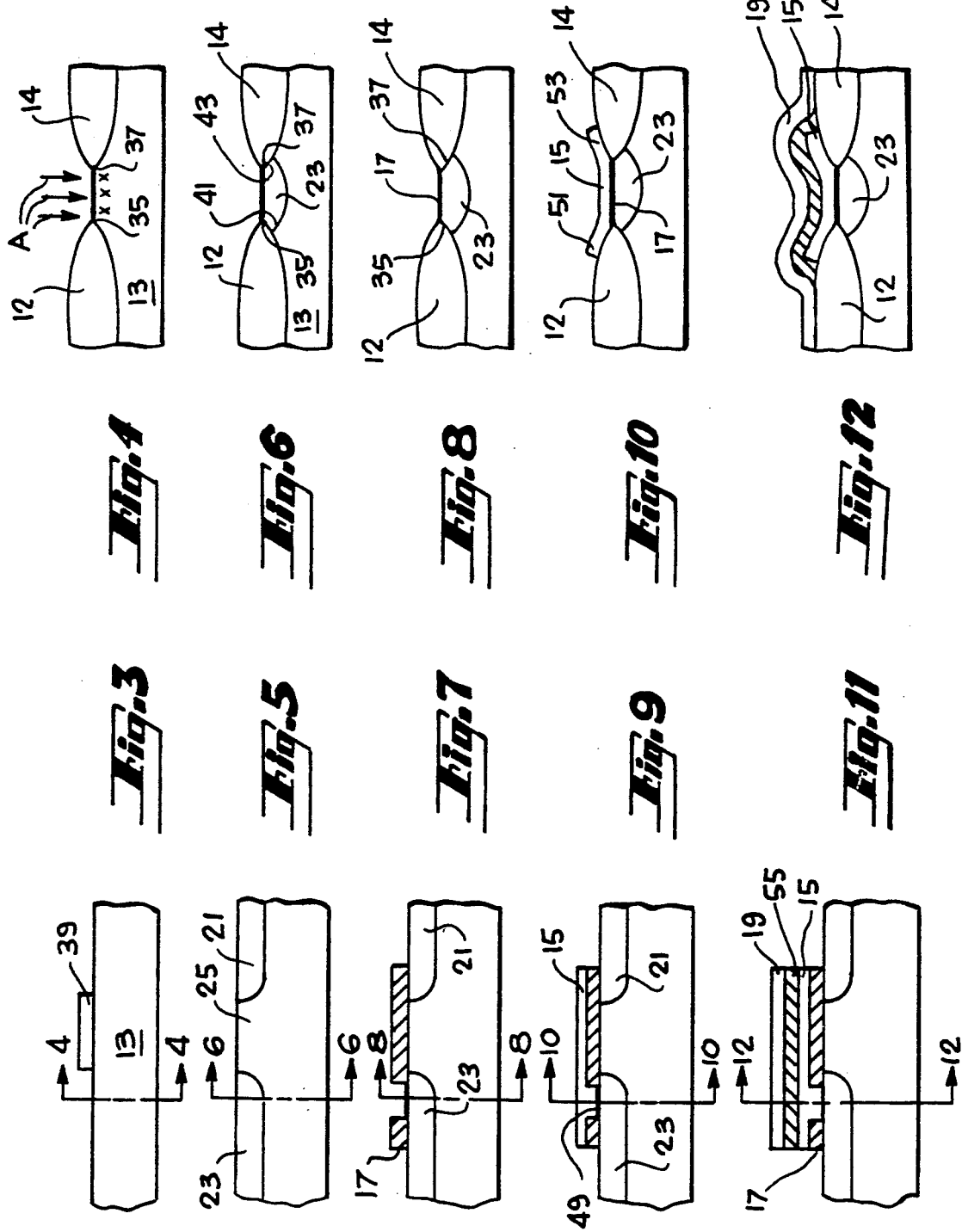

FABRICATING A NARROW WIDTH EEPROM WITH SINGLE DIFFUSION ELECTRODE FORMATION

This is a divisional of copending application(s) Ser. No. 07/616,460 filed on 11/21/90.

DESCRIPTION

1. Technical Field

The invention relates to an EEPROM structure and to method of making EEPROMs.

2. Background Art

Electrically erasable programmable read only memories, EEPROMs, are MOS transistor storage devices used in applications where there is a need for changing programming or recording data in a digital circuit. These devices, termed non-volatile memories, retain their storage state after power is removed, unlike memory devices known as static memory (SRAM) or dynamic memory (DRAM) which immediately lose their storage state when power is disconnected. First appearing in the 1970's, EEPROMs are characterized by a "floating gate" onto which electrical charge may be injected by a phenomenon known as "tunneling".

An early article describing such a device is entitled "A 256-bit Non-volatile Static RAM" by E. Harari in the 1978 IEEE International Solid State Circuits Conference report. In such circuits, a relatively high voltage, about 20 volts, is used to create a high electric field between the floating gate and a charge supply region, such as the drain or a region associated with the drain. Electrons are able to jump or tunnel through very thin insulation material separating the floating gate from the charge supply region without damage to the insulation separating the two regions, a phenomenon known as Fowler-Nordheim tunneling. Similarly, by application of an opposite high voltage charge may be removed from the floating gate, discharging the device.

In FIGS. 4 and 4a of U.S. Pat. No. 4,132,904 to E. Harari there is shown an EEPROM with drain and source formed in a single diffusion step prior to formation of field oxide, there being an overlap between the diffusion and the field oxide. The tunneling region is a square located in and over the source or drain electrodes. The floating gate resides in the channel and overlaps the two opposed field oxide barrier walls, as seen in FIG. 4a.

Charge storage on the floating gate is indicative of a digital signal, i.e. a one or zero, and may be read by observing the threshold voltage at which the transistor containing the floating gate begins to conduct. A first threshold voltage indicates a positive charge storage on the floating gate, while a second threshold voltage indicates a negative charge storage.

An MOS EEPROM is found in U.S. Pat. No. 4,203,158 to D. Frohman-Bentchkowsky, J. Mar, George Perlegos and W. Johnson. This design features an extra or "third region" which supplies charge to the floating gate. The first and second regions are the source and drain regions. A thin dielectric is defined between the floating gate and third region. Tunneling occurs between the third region and the floating gate, through the thin dielectric.

A more recent MOS EEPROM design is disclosed in U.S. Pat. No. 4,822,750 to Gust Perlegos and T. C. Wu. This design features a cell similar to the Frohman-Bentchkowsky design but with a third region which extends completely across the cell and beyond, extending appreciably under the field oxide. This design requires two diffusion or implant steps because in order to depress portions of the third region, it is necessary to lay the third region down before the field oxide. After the field oxide is laid down and after the floating poly or control gate is laid down, the source and drain diffusions are made in a second diffusion or implant step.

In U.S. Pat. No. 4,477,825 Yaron et al. teach an EEPROM design with a thin dielectric having borders which are located interior to and displaced from borders of the field oxide layer.

An object of the invention is to provide a EEPROM design which is reduced in cell size and having a simplified manufacturing process.

SUMMARY OF THE INVENTION

We have devised a stripe or linear widthwise geometry for EEPROM devices featuring a single step diffusion process which defines source, drain and channel of a floating gate transistor after field oxide regions have been established. The widthwise dimension exists between parallel, spaced apart field oxide barrier walls, and in particular the interior boundaries of those walls. The widthwise lines which define electrodes, thin oxide and the channel, of the present invention all have some length and so appear as short stripes extending all the way between the interior boundary regions of the opposed field oxide barrier walls.

The present invention begins with field oxide formation. After the field oxide is established with opposed widthwise barrier walls, source, drain and channel are established in the single step previously mentioned. The single step of forming the two spaced apart electrodes and channel involves implanting of ions followed by diffusion of the ions in a drive-in procedure. The drive-in of the ions produces the abutment with the field oxide. By forming the drain from the top and into abutment with the field oxide at opposite sides of the cell, there are no exposed edges because junctions are formed against the field oxide below the substrate surface and thus not exposed to the thin oxide. We found that this method allows for a more compact cell and a simpler manufacturing process than previously disclosed designs.

The present invention includes a thin oxide window fabricated as a stripe or line, where a very thin layer of oxide contacts the substrate. Polysilicon is deposited to form the floating gate separated from the drain by the thin oxide. The remainder of the floating gate is separated from the substrate, including drain portions, the channel and the source by thicker oxide. The floating gate overlaps the field oxide on opposed sides. The window region defines the tunnel region for charge carriers tunneling to and from the floating gate and the drain. In other words, the charge supply region below the window is the drain electrode of an MOS transistor.

The cell width is now smaller and so the memory cell is more compact. The cell width is limited only by the ability of manufacturing apparatus to minimize feature size.

BRIEF DESCRIPTION OF THE DRAWINGS

FIG. 3 is a side sectional view in a method for making the structure of FIG. 1.

FIG. 4 is a side sectional orthogonal view of FIG. 3 taken along lines 4—4.

FIG. 5 is a side sectional view in a method for making the structure of FIG. 1.

FIG. 6 is a side sectional orthogonal view of FIG. 5 taken along lines 6—6.

FIG. 7 is a side sectional view in a method for making the structure of FIG. 1.

FIG. 8 is a side sectional orthogonal view of FIG. 7 taken along lines 8—8.

FIG. 9 is a side sectional view in a method for making the structure of FIG. 1.

FIG. 10 is a side sectional orthogonal view of FIG. 9 taken along lines 10—10.

FIG. 11 is a side sectional view in a method for making the structure of FIG. 1.

FIG. 12 is a side sectional orthogonal view of FIG. 11 taken along lines 12—12.

BEST MODE FOR CARRYING OUT THE INVENTION

Figures 1, 2A:
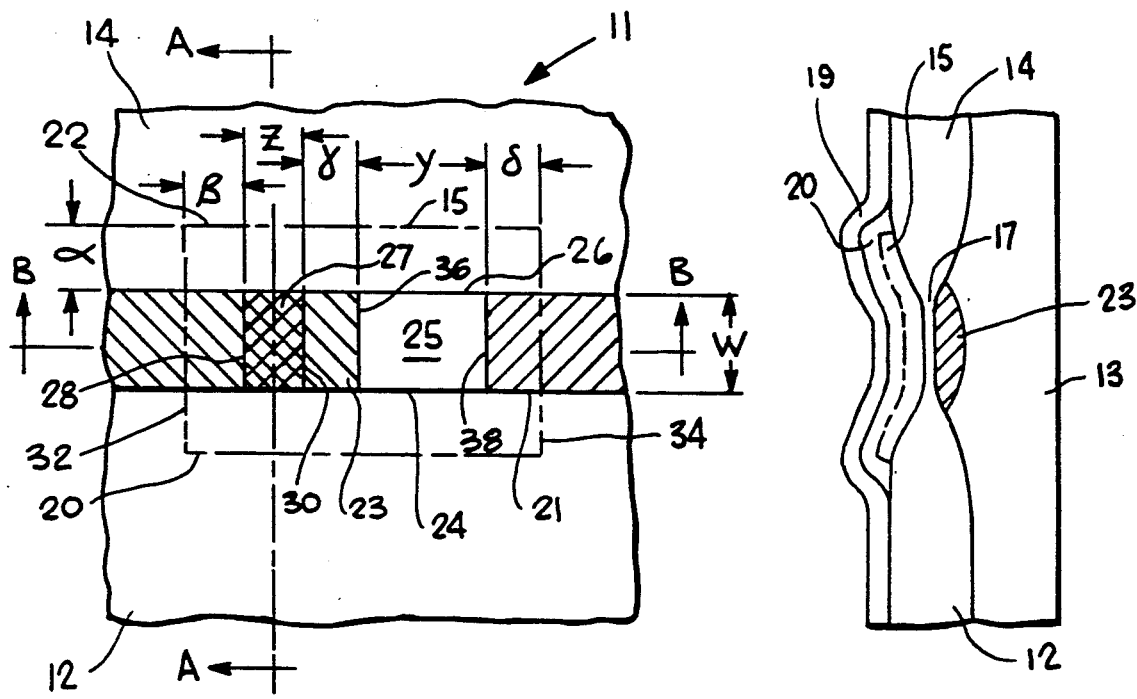
FIG. 1 is a top plan view of an EEPROM structure in accord with the present invention.
FIGS. 2A and 2B are side sectional views taken along lines 2A—2A and 2B—2B, respectively, in FIG. 1.
Figure 2B:
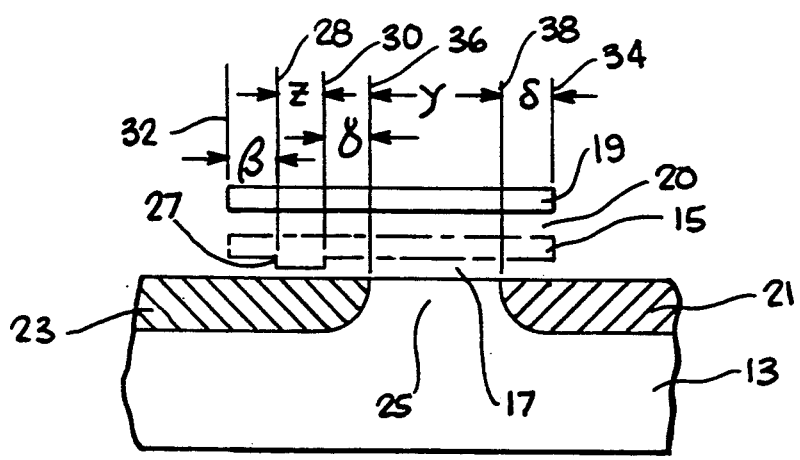

With reference to FIGS. 1, 2A and 2B, a narrow width electrode EEPROM 11 is shown, having been fabricated between opposed field oxide barrier walls 12 and 14. The "width" dimension is indicated by the letter "W" in FIG. 1, while the length is perpendicular to the width. Because the cell geometry employs only parallel lines, i.e. stripes, the active cell width may be as small as 0.3 micrometers. The structure has been built on a silicon wafer substrate 13. Electrodes which are part of the EEPROM structure include floating gate 15, which is supported over the substrate 13 mainly by a dielectric layer, such as an oxide layer 17, seen only in FIG. 2A. A control gate 19 extends over floating gate 15 and is spaced from that gate by insulative layer 20.

Implanted into the substrate are parallel, stripe-shaped, subsurface source 21 and drain 23. It will be seen that the source and drain are spaced apart by a stripe-shaped channel region 25. The source 21, drain 23 and channel 25 all have opposed lateral edges abutting opposed interior boundaries of oxide barrier walls 12 and 14. These boundaries are tapering edges, when LOCOS is used or vertical walls when trench isolation is used. The present invention contemplates drain abutment with the field oxide in either situation. Overlying the substrate 13 in an area below the floating gate 15, but above the drain 23 is a stripe of very thin oxide 27 indicated by the cross-hatched lines in FIG. 1. The thin oxide stripe is the region where charge carriers may tunnel from the drain 23 to the floating gate 15.

Other transistor structures may be fabricated between the same oxide barrier walls 12 and 14. For example, a transistor which selects the floating gate transistor is frequently built proximate to the floating gate structure. These are usually conventional MOS transistors and so are not shown.

Returning to FIG. 1, the opposed edges of the oxide barrier walls, i.e. the interior widthwise boundaries are shown approximately located at spaced apart lines 24 and 26. The narrow spacing of the opposed walls may be less than 1.5 microns from edge to edge. It will be seen that the stripe electrodes 21 and 23, as well as channel 25 and the thin oxide stripe 27 all abut the opposed lateral edges of the field oxide, 24 and 26. While the floating gate 15 is indicated by the dot and dash line, the control gate is not shown in FIG. 1, but would be on top of the floating gate. The opposed field oxide barrier walls 12 and 14 in FIG. 2A define the lateral limits of the EEPROM active electrode structure. The floating gate extends over the top of the barrier walls and the control gate extends beyond the floating gate for communication of signals to adjoining devices. The source and drain communicate parallel to the field oxide walls as best seen in FIG. 2B.

The remote widthwise edges of the floating gate 15 are indicated by lines 20 and 22. These edges are beyond the width of the cell active electrodes which has limits at field oxide boundary lines 24 and 26 and so the floating gate overlaps field oxide portions outwardly of the field oxide interior boundary. The extent of overlap is indicated by the letter alpha, $\alpha$, between lines 22 and 26. Reduction in this dimension, while desirable, is limited by alignment tolerances of manufacturing equipment.

In the lengthwise direction the thin oxide stripe 27 has opposite edges indicated by lines 28 and 30, with the length of the stripe indicated by the letter Z. The lengthwise edges of the floating gate are indicated by opposed parallel lines 32 and 34. The length of the floating gate between outward boundary 32 and thin oxide boundary line 28 is designated by the letter beta, $\beta$.

The channel 25 has opposed parallel lengthwise boundaries 36 and 38, the channel length being designated by the letter Y. The length between the channel boundary 36 and the thin oxide stripe boundary 30 is designated by the letter gamma, $\gamma$. There should always be some extent of $\gamma$, preferably 0.5 $\mu$, but as low as 0.3 $\mu$. The total lengthwise extent of this region, $\gamma$, is equal to the side diffusion length plus alignment tolerances. The length between the channel boundary 38 and the floating gate outward boundary 34 is designated by the letter delta, $\delta$. In a preferred embodiment, reduction of the lengths $\beta$, $\gamma$ and $\delta$ is limited by alignment tolerances of the manufacturing equipment. The dimensions Z and W are made as small as possible, but preferably limited by the line resolution capability, with the desired control, of the manufacturing process.

In summary, the floating gate transistor, characterized by the parameters $\alpha$, $\beta$, $\gamma$ and $\delta$, depends on process equipment alignment tolerances. On the other hand, cell width W and oxide stripe length Z, may depend on the line resolution capabilities of the manufacturing equipment. The channel length Y can be limited by the line resolution capabilities or may be selected independently, giving weight to electrical characteristics, such as desired operating drain voltage in the case of a non-conducting state of the memory cell. Defining the drain and source electrodes, the channel, and thin oxide width to be within the straight line field oxide walls results in a cell with efficient programming characteristics with wall spacings as small as they can be made. This minimizes the floating poly to drain capacitance of the thicker oxide dielectric. Having the thin oxide the same width as the channel requires the field oxide wall spacings to be narrow for efficient programming. The total capacitance between floating gate and electrodes or channel has been reduced. Furthermore, having the abutment of source, drain, channel, and thin oxide stripes, defined within the field oxide walls allows for minimizing of the cell width. The minimum cell width is determined by the field oxide wall spacing and the floating poly spacing plus the overlap of the field walls.

With reference to FIGS. 3 and 4 the formation of an EEPROM in accord with the present invention may be seen. The first step is the establishment of field oxide barrier walls 12 and 14 which extend partially into substrate 13. The field oxide barrier walls may be formed by the well-known "trench" isolation, involving etching a silicon substrate and then filling the etch zone with oxide having near vertical walls or by use of silicon nitride masks and growing of field oxide. The thickness of the field oxide is approximately (1) micrometer. The central portion of substrate 13 where the channel will ultimately reside is masked with a stripe mask 39. Mask 39 prevents implantation of dopants through the mask and into the substrate region immediately below the mask. The mask also provides alignment for the electrode stripes to be implanted into substrate 13 on either side of the mask.

In FIG. 4, the implantation of dopants into the non-masked region of the substrate is indicated by the arrows A. Implantation of Arsenic ions with a dose of $2.8 \times 10^{13}$ ions/cm$^2$ at 100 keV provides opposed stripes of n+ conductivity in the substrate, which is p type conductivity. In FIG. 4, the drain is about to be formed by the doping which extends between the opposed field oxide barrier walls 12 and 14 in an elongated stripe.

With reference to FIGS. 5 and 6, the drain 23, channel 25 and source 21 are shown to have been defined in a single implantation step, followed by a moderate diffusion drive-in step at 1070° C. for 3 hours. It is well known that an equivalent diffusion can be achieved with less time and higher temperature or more time and lower temperature, in accordance with the diffusivity of As at different temperatures. A low surface concentration of the drain region will not be adequate for tunneling of electrons out of the floating gate. The depth of the source and drain region is approximately 0.6 micrometers and the effective length of the channel is approximately 1.0 micrometers. In FIG. 6, the drain 23 may be shown to have opposed sides 41 and 43 in abutment with the interior boundaries 35 and 37 of the field oxide walls 12 and 14. The abutment is sufficient to preclude the n+ to substrate junction to be near the floating poly above the thin oxide region.

With the floating gate negatively charged and applying a high positive voltage in the drain electrode in order to tunnel electrons out of the floating gate results in a large electric field at the drain to field oxide wall boundary near the thin oxide edge. If abutment distance is too small the drain junction will break down and current will flow to the substrate.

In FIGS. 7 and 8, a thin gate oxide is grown by first etching a stripe of the thicker oxide over the drain. The thin gate oxide itself is grown as a stripe extending between opposed field oxide barrier walls. The thickness of the oxide stripe 17 is about 80 Å over the drain and serves as the Fowler-Nordheim tunneling region for charge carriers between the drain 23 and the floating gate.

In FIGS. 9 and 10, the polysilicon floating gate 15 is formed over drain 23, source 21 and the channel. The floating gate, including the silicon tip 49 is seen to have opposed sides 51 and 53. In the present invention, electrons tunnel from drain stripe 23 through the thin oxide 17 into the floating gate 15 via the tip 49 and reside there until removed by reverse action.

With reference to FIGS. 11 and 12, a dielectric layer 55 is shown to have been deposited or formed over floating gate 15. The control layer 19 is polysilicon deposited over the insulating dielectric layer 20.

The resulting structure is quite compact, defined in the widthwise direction by the field oxide on both ends, yet reliable and easy to fabricate because straight lines are relatively easy to control even in the smallest of geometries, compared to non-straight line patterns. Moreover, the fabrication of source and drain in a single diffusion, followed by definition of the tunnel oxide, eliminates steps which were required in prior designs.

We claim:

1. A method of making an MOS floating gate transistor cell comprising, disposing field oxide at least partially in a substrate to define opposed, spaced apart, linear barrier walls for a transistor, placing, in a single step, parallel, spaced apart doped regions in the substrate within the barrier walls in a parallel, linear pattern extending from one field oxide wall to an opposed field oxide wall, diffusing the doped regions to form source and drain electrodes having sides in abutment with opposed field oxide barrier walls, the spaced apart distance between the source and drain forming a channel, forming a thin oxide layer with surrounding dielectric over the drain electrode, with the thin oxide having linear boundaries, the thin oxide being thinner than the surrounding oxide forming an insulation layer over said source and drain electrodes and channel, said thin oxide formed within specified aligning tolerances and at a distance $\gamma$ from the channel, and within specified line resolution tolerances of etching said thicker insulating layer over drain electrode, the thin oxide having a length dimension Z, forming a floating gate electrode atop the thin oxide, and channel within specified aligning tolerances, said floating gate overlapping said opposed barrier walls by a dimension $\alpha$, overlapping said drain electrode beyond said thin oxide by a dimension $\beta$, overlapping said source electrode by a dimension $\delta$, and forming a control electrode in insulated relation over the floating gate electrode.

2. The method of claim 1 wherein said placing of doped regions is by implanting ions.

3. The method of claim 1 wherein said placing of doped regions is by ions, implanting comprises doping the substrate with Arsenic ions at a dose higher than $1 \times 10^{13}$ cm$^{-2}$.

4. The method of claim 1 wherein said diffusing is with Arsenic ions of concentration which is larger than $1 \times 10^{13}$ cm$^{-2}$ and carried on for more than 2 hours at a temperature higher than 1040° C.

* * * * *